US009826630B2

(12) United States Patent
Vincent

(10) Patent No.: US 9,826,630 B2
(45) Date of Patent: Nov. 21, 2017

(54) FAN-OUT WAFER LEVEL PACKAGES HAVING PREFORMED EMBEDDED GROUND PLANE CONNECTIONS AND METHODS FOR THE FABRICATION THEREOF

(71) Applicant: Michael B. Vincent, Chandler, AZ (US)

(72) Inventor: Michael B. Vincent, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 182 days.

(21) Appl. No.: 14/477,729

(22) Filed: Sep. 4, 2014

(65) Prior Publication Data

US 2016/0073496 A1    Mar. 10, 2016

(51) Int. Cl.
| | |
|---|---|
| H05K 3/30 | (2006.01) |
| H05K 1/02 | (2006.01) |
| H05K 1/11 | (2006.01) |
| H05K 1/18 | (2006.01) |
| H05K 3/46 | (2006.01) |
| H05K 3/10 | (2006.01) |

(Continued)

(52) U.S. Cl.
CPC .......... *H05K 1/0298* (2013.01); *H01L 21/78* (2013.01); *H01L 23/552* (2013.01); *H01L 24/19* (2013.01); *H01L 24/96* (2013.01); *H01L 24/97* (2013.01); *H05K 1/0218* (2013.01); *H05K 1/115* (2013.01); *H05K 1/181* (2013.01); *H05K 3/0073* (2013.01); *H05K 3/10* (2013.01); *H05K 3/4644* (2013.01); *H01L 21/561* (2013.01); *H01L 21/568* (2013.01); *H01L 2224/12105* (2013.01); *H01L 2924/19105* (2013.01); *H05K 2201/0715* (2013.01); *Y10T 29/4913* (2015.01)

(58) Field of Classification Search
CPC .... H05K 1/0298; H05K 1/0218; H05K 1/115; H05K 1/181; H05K 3/4644; H05K 3/10; H05K 3/0073; H05K 2201/0715; H01L 23/552; H01L 23/3128; H01L 21/56; H01L 21/78; H01L 24/03; Y10T 29/49002; Y10T 29/49155; Y10T 29/49117; Y10T 29/4922
USPC ....... 29/832, 830, 829, 825, 592.1; 361/772; 174/251, 350; 438/113, 127
See application file for complete search history.

(56) References Cited

U.S. PATENT DOCUMENTS

| | | | |
|---|---|---|---|
| 5,948,533 A | * | 9/1999 | Gallagher .......... B23K 35/0222 174/255 |
| 8,138,062 B2 | | 3/2012 | Liu et al. |

(Continued)

OTHER PUBLICATIONS

Pabst, Eduard J., US Patent Application entitled "Shielded Device Packages and Related Fabrication Methods," filed on Oct. 17, 2013.

*Primary Examiner* — Peter DungBa Vo
*Assistant Examiner* — Azm Parvez

(57) ABSTRACT

Fan-Out Wafer Level Packages (FO-WLPs) and methods for fabricating FO-WLPs having Embedded Ground Plane (EGP) connections are provided. In one embodiment, the method includes forming a molded panel around an EGP array from which a plurality of preformed EGP connections project. One or more Redistribution Layers (RDLs) are produced over the molded panel. The molded panel is then singulated to yield a plurality of FO-WLPs each including a molded package body containing an EGP from the EGP array and one or more of preformed EGP connections.

14 Claims, 6 Drawing Sheets

(51) Int. Cl.
*H05K 3/00* (2006.01)
*H01L 23/552* (2006.01)
*H01L 21/78* (2006.01)
*H01L 23/00* (2006.01)
*H01L 21/56* (2006.01)

(56) References Cited

U.S. PATENT DOCUMENTS

| | | | |
|---|---|---|---|
| 8,881,387 B2 * | 11/2014 | Lin | H05K 1/0218 156/384 |
| 2009/0294982 A1 | 12/2009 | Kim et al. | |
| 2010/0072582 A1 | 3/2010 | Chandra et al. | |
| 2010/0127396 A1 * | 5/2010 | Tang | H01L 23/50 257/773 |
| 2010/0207258 A1 | 8/2010 | Eun et al. | |
| 2011/0037169 A1 * | 2/2011 | Pagaila | H01L 21/561 257/737 |
| 2011/0115060 A1 | 5/2011 | Chiu et al. | |
| 2012/0049344 A1 * | 3/2012 | Pagaila | H01L 21/56 257/737 |

* cited by examiner

FAN-OUT WAFER LEVEL PACKAGES HAVING PREFORMED EMBEDDED GROUND PLANE CONNECTIONS AND METHODS FOR THE FABRICATION THEREOF

TECHNICAL FIELD

Embodiments of the present invention relate generally to microelectronic packaging and, more particularly, to Fan-Out Wafer Level Packages (FO-WLPs) and methods for fabricating FO-WLPs.

BACKGROUND

By way of example, a FO-WLP includes a molded package body having a frontside and an opposing backside. One or more frontside Redistribution Layers (RDLs) are formed over the frontside of the package body, and a Ball Grid Array (BGA) or other contact array is often produced over the frontside RDLs. The RDLs contain metal traces or interconnect lines, which electrically couple the solder balls of the BGA to the microelectronic device or devices contained within the package body. The microelectronic devices contained within the package body commonly include at least one semiconductor die, but may also include other microelectronic devices (e.g., Surface Mount Devices or "SMDs"). To further increase the functionality of the FO-WLP, additional structures, features, or microelectronic devices can be formed on or mounted to the backside of the molded package body. For example, in the case of a so-called "double-sided FO-WLP," one or more backside RDLs and possibly an additional contact array can be formed over the backside of the molded package body. In such instances, Through Package Vias (TPVs) can be formed to provide electrically-conductive paths extending through the molded package body and allow vertical interconnection between the frontside RDLs and the electrically-conductive structures or devices disposed on the backside of the package body.

Significant advancements have been made toward reducing the size of FO-WLPs, while maximizing the functionality or device density thereof. Nonetheless, there exists an ongoing demand to bring about still further reductions in the planform dimensions of FO-WLPs, while increasing or maintaining the functionality thereof. Further, it would be desirable to provide embodiments of a method for fabricating such a FO-WLP in a high volume, low cost manner. Other desirable features and characteristics of the present invention will become apparent from the subsequent Detailed Description and the appended Claims, taken in conjunction with the accompanying Drawings and the foregoing Background.

BRIEF DESCRIPTION OF THE DRAWINGS

At least one example of the present invention will hereinafter be described in conjunction with the following figures, wherein like numerals denote like elements, and.

Figure 1:
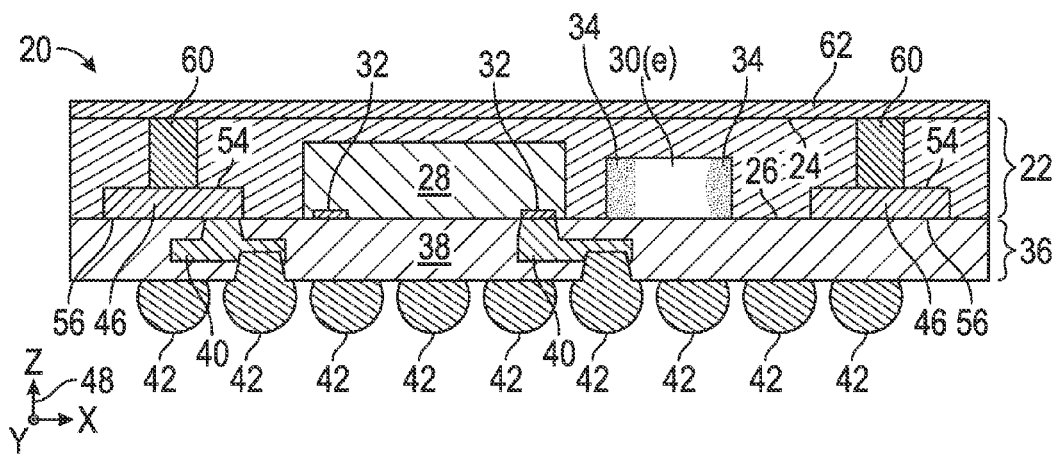
FIGS. 1 and 2 are side and planform cross-sectional views, respectively, of a FO-WLP including an embedded ground plane, a backside electromagnetic interference shield, and at least one preformed EGP connection in the form of a continuous or substantially continuous wall, as illustrated in accordance with a first exemplary embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following describes exemplary embodiments of FO-WLPs and methods for producing FO-WLPs including preformed Embedded Ground Plane (EGP) connections; that is, EGP connections produced and bonded to an EGP prior to formation of a molded package body around the EGP and the EGP connections. The preformed EGP connections provide electrically conductive paths between the EGP and the backside of the molded package body. In so doing, the preformed EGP connections eliminate the need for separately-formed TPVs to reduce processing requirements and to minimize the overall planform dimension of the FO-WLP, although the possibility that the EGP connections can be utilized in conjunction with TSVs in alternative embodiments is not precluded. The preformed EGP connections can be electrically coupled to various different structures or features located on the backside of the molded package body including, for example, backside RDLs or backside-mounted microelectronic devices. In certain embodiments, the preformed EGP connections are electrically coupled to an Electromagnetic Interference (EMI) shield bonded to the backside of the FO-WLP. A given FO-WLP can include multiple preformed EGP connections in the form of a number discrete bodies or structures (e.g., vertically-elongated columns), which are bonded to and extend from the EGP at selected locations. Alternatively, the preformed EGP connections can be formed as one or more substantially continuous walls, which may extend fully or partially around the perimeter of the EGP. In such embodiments, the preformed EGP connections can combine with a backside EMI shield to produce an electrically-conductive, three dimensional, box-shaped enclosure or "EMI cage," which surrounds one or more microelectronic devices embedded within the molded package body. Such embodiments can be particularly useful in implementations wherein the FO-WLP contains radio frequency (RF) die or other circuitry susceptible to radio frequency interface (RFI) or when it is desired to minimize stray electromagnetic energy emitted from the FO-WLP.

Figure 2:
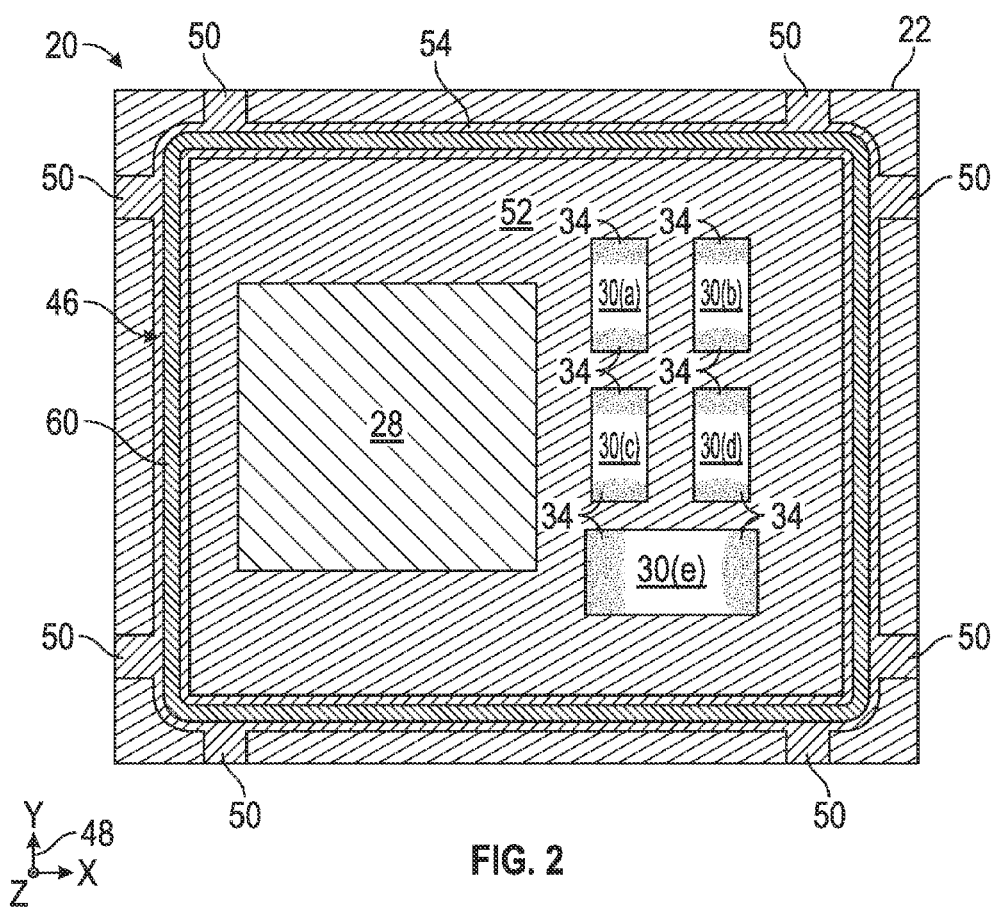

FIGS. 1 and 2 are side and planform cross-sectional views, respectively, of a FO-WLP 20, as illustrated in accordance with an exemplary embodiment of the present invention. As identified in FIG. 1, FO-WLP 20 includes a molded package body 22 having a first principal surface or "backside" 24 and a second, opposing principal surface or "frontside" 26. One or more microelectronic devices are embedded within molded package body 22. The number and type of microelectronic devices embedded within molded package body 22 will vary amongst embodiments depending upon the design and functionality of FO-WLP 20. In the illustrated embodiment, and as shown most clearly in FIG. 2, molded package body 22 contains multiple electrical components, including a semiconductor die 28 and a small grouping of discrete SMDs 30(a)-(e). SMDs 30(a)-(e) can be, for example, discrete resistors, capacitors, inductors, diodes, or any combination thereof. In one embodiment, semiconductor die 28 is a radio frequency (RF) die (e.g., a die designed to receive, process, and/or produce RF signals) and SMDs 30(a)-(e) are interconnected to produce RF frontend or backend circuitry. In alternative embodiments, other components can be interconnected in different manners to form any RF frontend or backend circuitry that might be included in the FO-WLP. In other words, semiconductor die 28 and/or SMDs 30(a)-(e) may be configured to operate at RF. Semiconductor die 28 includes a number of bond pads 32 formed on the frontside thereof, and SMDs 30(a)-(e) each include opposing electrically-conductive end terminals 34. Alternatively, SMDs 30(a)-(e) may include electrically-conductive terminals on their top or bottom surfaces. Die 28 and SMDs 30(a)-(e) are embedded in molded package body 22 such that bond pads 32 (FIG. 1) and terminals 34 are exposed at and are substantially coplanar with frontside 26 of molded package body 22.

One or more RDLs 36 are formed over frontside 26 of molded package body 22. RDLs 36 include a dielectric body 38 containing a number of electrically-conductive interconnect lines 40 (two of which can be seen in FIG. 1). Dielectric body 38 can be composed of a number of dielectric layers successively spun-on or otherwise deposited over frontside 26, and interconnect lines 40 can be plated metal (e.g., copper) traces interspersed with the dielectric layers. In the illustrated example, a BGA comprised of solder balls 42 is further produced over the outermost or last layer of dielectric body 38 (e.g., a solder mask layer). Interconnect lines 40 electrically couple end terminals 34 of SMDs 30(a)-(e), bond pads 32 of semiconductor die 28, and BGA solder balls 42, as appropriate, to complete the wiring structure of FO-WLP 20. In further embodiments, FO-WLP 20 can be produced to include another type of Input/Output (I/O) interface and associated interconnect structures, which can include any combination of contact arrays (e.g., BGAs, Land Grid Arrays, bond pads, stud bumps, etc.), RDLs, lead-frames, interposers, wire bonds, through package vias, and the like. Furthermore, FO-WLP 20 need not include externally-accessible points-of-contact in all embodiments and can instead communicate wirelessly via an antenna structure, while being powered by an internal battery or energy harvesting system.

With continued reference to FIGS. 1 and 2, at least one EGP 46 is embedded within molded package body 22 along with die 28 and SMDs 30(a)-(e). EGP 46 includes an electrically-conductive (e.g., copper) body having opposing surfaces 54 and 56. EGP surface 54 faces backside 24 of molded package body 22 and is bonded to one or more EGP connections 60, as described below. Conversely, EGP surface 56 faces away from package body 22 and is substantially coplanar with frontside 26 of molded package body 22. In this manner, selected interconnect lines 40 can be formed in contact with EGP surface 56 to electrically couple EGP 46 to the electrical ground and to the components of FO-WLP 20, as needed. As shown most clearly in FIG. 2, EGP 46 has a generally rectangular planform geometry and includes a central opening 52 in which semiconductor die 28 and SMDs 30(a)-(e) are positioned. EGP 46 thus extends around an outer peripheral portion of molded package body 22 to circumscribe die 28 and SMDs 30(a)-(e) in the illustrated embodiment. In further embodiments, EGP 46 can assume other planform shapes and may not extend around all or any of the microelectronic devices embedded within molded package body 22. Further, in other embodiments, EGP 46 may have portions that extend between adjacent ones of the microelectronic devices embedded within molded package body 22. A number of spars 50 (shown in FIG. 2) extends outwardly from the rectangular body of EGP 46 to the sidewalls of package body 22. During manufacture of FO-WLP 20, spars 50 join EGP 46 to a plurality of other EGPs, which collectively form an interconnected EGP array 70 (described below in conjunction with FIGS. 3 and 4). During manufacture of FO-WLP 20, the interconnected EGP array can be embedded within a larger molded panel and then separated into discrete EGPs during panel singulation, as further described below in conjunction with FIG. 12.

FO-WLP 20 further includes at least one preformed EGP connection 60, which is bonded to and extends from EGP 46. As noted above, EGP connection 60 is referred to as "preformed" to denote that connection 60 is produced and bonded to EGP 46 prior to encapsulation within molded package body 22 and, more generally, within a larger molded panel from which package body 22 is produced. EGP connection 60 extends from inwardly-facing surface 54 of EGP 46 to backside 24 of molded package body 22. EGP connection 60 preferably extends from inwardly-facing surface 54 of EGP 46 along an axis substantially parallel to the centerline of FO-WLP 20 or, stated differently, along a vertical axis orthogonal to backside 24 of package body 22 (corresponding to the Z-axis identified in FIGS. 1 and 2 by coordinate legend 48). As a point of emphasis, EGP connection 60 can assume any form able to remain bonded to EGP 46 through the below-described encapsulation or panelization process, while providing one or more electrically-conductive paths extending from EGP 46 to package body backside 24 when FO-WLP 20 is complete. In the illustrated example, and as shown most clearly in FIG. 2, EGP connection 60 assumes the form of a substantially continuous or unbroken wall, which extends over and around the general rectangular body of EGP 46. As a result, EGP connection 60 has a planform geometry that is substantially conformal with the planform geometry of EGP 46 (in this case, a rectangular planform geometry forming a closed-plane shape). Similarly, as does EGP 46, EGP connection 60 extends around or circumscribes die 28 and SMDs 30(a)-(e), as taken along the centerline of FO-WLP 20. In the illustrated example, EGP connection 60 has a height exceeding the height or thickness of EGP 46 (taken along the Z-axis) and a width less than the width of EGP 46 (as taken along the X- or Y-axis). In further embodiment, the relative dimensions of EGP connection 60 and EGP 46 can vary.

While, in the illustrated example, preformed EGP connection 60 assumes the form of a substantially continuous wall forming closed (e.g., rectangular) polygonal shape, preformed EGP connection 60 can assume other forms in further embodiments. For example, preformed EGP connection 60 can be divided into multiple walls, which extend along and are substantially parallel with the sides of EGP 46. In this case, preformed EGP connection 60 can still cooperate with backside EMI shield 62 to produce a box-like enclosure or cage, as described below. Preformed EGP connection 60 can also assume other forms or shapes including, for example, a plurality of discretely-formed columns or leads, such as those described below in conjunction with FIGS. 13 and 14. Regardless of the particular shape assumed thereby, preformed EGP connection 60 can be formed directly on and thus bonded to EGP 46. Such in-place formation of EGP connection 60 can be accomplished by depositing a flowable electrically-conductive material on EGP surface 54 utilizing, for example, a stencil printing process. Alternatively, EGP connection 60 can be a separately-fabricated body or component, such as a discrete metal piece, which is bonded to EGP 46 prior to the below-described panelization process utilizing an electrically-conductive bonding material. In still another alternate embodiment, EGP 46 and EGP connection 60 may be preformed together as a single structure. Further discussion of exemplary manners in which EGP connection 60 can be formed is provided below in conjunction with FIGS. 5-7.

Various different structures can be produced on, applied over, or mounted to the backside of FO-WLP 20 and electrically coupled to EGP 46 through preformed EGP connection 60. For example, a number of backside RDLs, which may be similar to frontside RDLs 36, can be produced over backside 24 of molded package body 22. In this case, additional microelectronic components or an additional contact array can be mounted to or formed over the backside RDLs. Alternatively, as shown in FIG. 1, an EMI shield 62 can be disposed over the backside of molded package body 22 and contact the regions of EGP connection 60 exposed at package body backside 24. EMI shield 62 can be any structure, layer, or layers suitable for reducing one or more types of EMI, such as radio frequency interference (RFI). In certain embodiments, EMI shield 62 can be a prefabricated metal sheet or plate, which is bonded to backside 24 of molded package body 22 utilizing an electrically-conductive bonding material. In preferred embodiments, however, EMI shield 62 is deposited as a continuous, electrically-conductive layer, such as a plated metal layer, a laminated layer, or deposited (e.g., sprayed or printed) coating. In this case, EMI shield 62 can be deposited to a thickness of about 5 to about 50 microns (μm) in an embodiment; the term "about," as appearing herein, denoting a disparity of less than 10%. In further embodiments, EMI shield 62 can be deposited or formed to have a thickness greater than or less than the aforementioned range. Further description of EMI shield 62 and exemplary manners in which EMI shield 62 can be formed is provided below in conjunction with FIG. 12.

As noted above, preformed EGP connection 60 assumes the form of a continuous or substantially continuous wall that extends around the body of EGP 46 in the exemplary embodiment shown in FIGS. 1 and 2. Preformed EGP connection 60 thus cooperates with EMI shield 62 to form a three dimensional, box-shaped, electrically-conductive structure, which surrounds or encloses semiconductor die 28 and SMDs 30(a)-(e) (referred to herein as an "EMI cage 60, 62"). Advantageously, EMI cage 60, 62 can provide excellent shielding of the components embedded within molded package body 22 from EMI, such as RFI. This may be particularly beneficial when die 28 and SMDs 30(a)-(e) are supportive of one or more RF functionalities and are susceptible to RFI or EMI in general. This is also beneficial when it is desired to limit stray electromagnetic energy emitted from die 28 and SMDs 30(a)-(e) during operation FO-WLP 20. Regardless of its particular planform shape, prefabricated EGP connection 60 provides one or more electrically conductive paths from EGP 46 to backside 24 of molded package body 22. Preformed EGP connection 60 can thus eliminate the need to provide a EGP backside connection utilizing one or more TPVs, which are typically formed laterally outboard of the EGP and spaced apart therefrom by a minimum standoff distance. As preformed EGP connections 60 overlap vertically with EGP 46, the usage of EGP connection 60 in place of such TPVs enables a reduction in the overall planform dimension of FO-WLP 20. Processing requirements are also reduced. These advantageous notwithstanding, embodiments of FO-WLP 20 can be produced to include both preformed EGP connections and TPVs, if desired.

Figure 3:
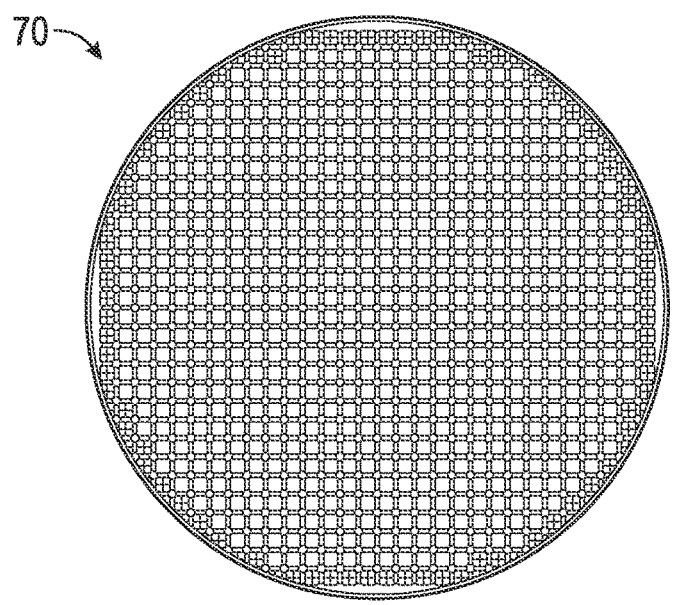
FIGS. 3 and 4 are planform views of an interconnected EGP array that can be embedded within a molded panel utilized to produce of a number of FO-WLPs, such as the exemplary FO-WLP shown in FIGS. 1 and 2.
Figure 4:
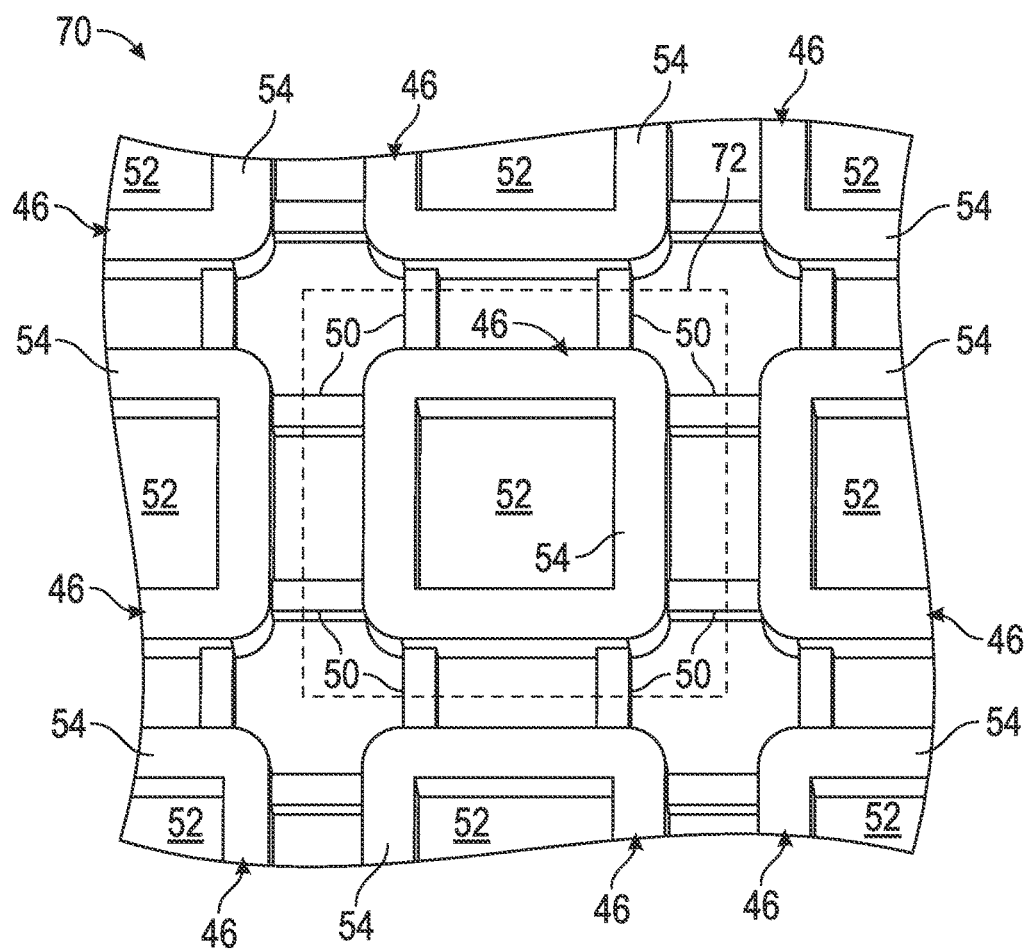

FO-WLP 20 can be produced in parallel with a number of other FO-WLPs by processing a molded panel to maximize manufacturing efficiency and throughput. As briefly mentioned above, an interconnected EGP frame or array can be embedded within the molded panel and then separated into discrete EGPs, such as EGP 46 shown in FIGS. 1 and 2, by panel singulation utilizing a high volume, low cost manufacturing process. FIGS. 3 and 4 are planform views of an exemplary interconnected EGP array 70 suitable for usage in the production of a number of other FO-WLPs, which may or may not be substantially identical to FO-WLP 20 (FIGS. 1 and 2). More specifically, FIG. 3 depicts an interconnected EGP array 70 at a wafer level, and FIG. 4 depicts an enlarged view of a portion of interconnected EGP array 70. As identified in FIG. 4, interconnected EGP array 70 includes a number of EGPs 46, which are mechanically interconnected or tied together by spars 50. Each EGP 46 has a central opening 52 in which one or more microelectronic devices, such as die 28 and SMDs 30(a)-(e), can be positioned within prior to the below-described encapsulation or panelization process. Prior to formation of the molded panel around interconnected EGP array 70, a number of preformed EGP connections are adhered to or formed in contact with the EGPs 46 making-up array 70. For consistency with the example above, and without limitation, the EGP connections will be referred to as "EGP connections 60" below and considered identical to EGP connection 60 shown in FIGS. 1 and 2. Two non-limiting examples of methods in which preformed EGP connections 60 can be produced on or otherwise bonded to interconnected EGP array 70 will now be described in conjunction with FIGS. 5-7.

Figure 5:
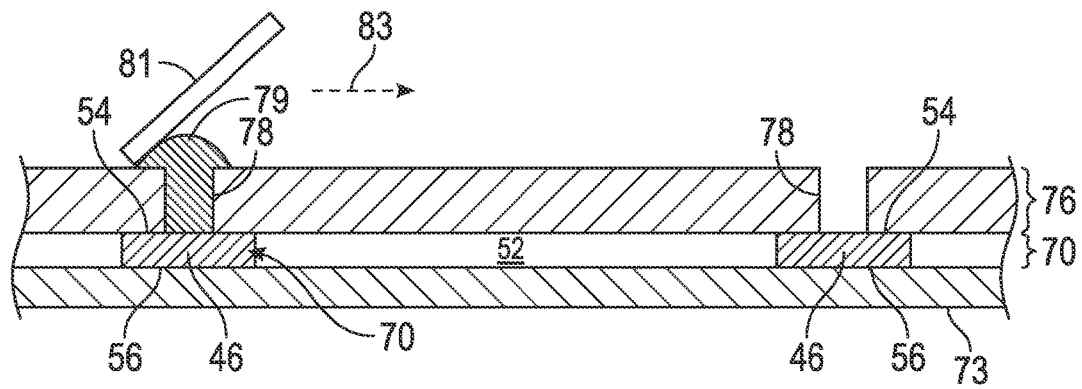
FIGS. 5 and 6 are cross-sectional views depicting a first exemplary manner in which a number of preformed EGP connections can be produced across the interconnected EGP array shown in FIGS. 3 and 4, as illustrated in accordance with an embodiment of the present invention.
Figure 6:
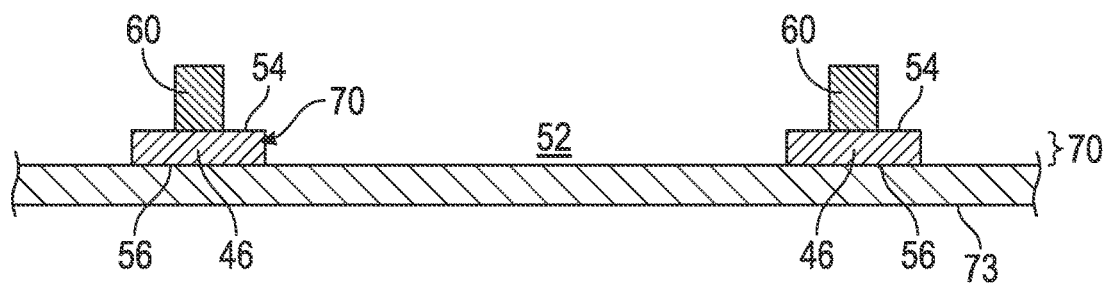
Figure 7:
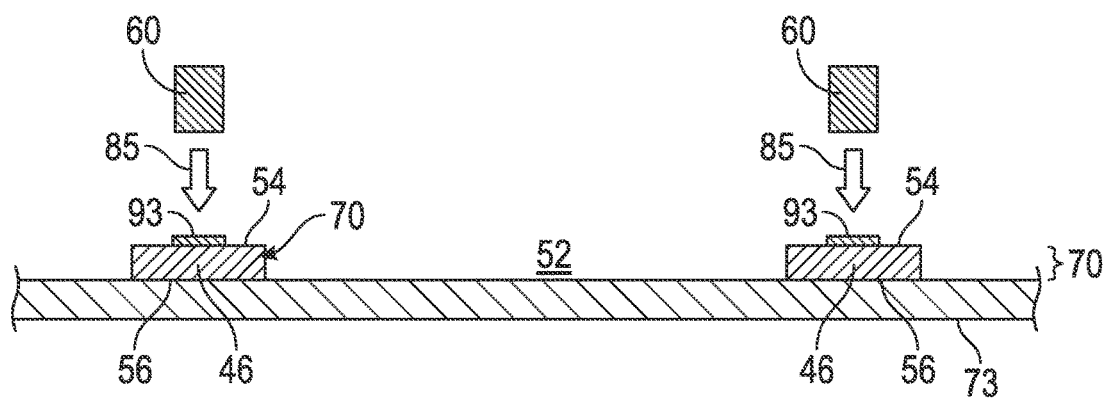
FIG. 7 is a cross-sectional view depicting a second exemplary manner in which a number of preformed EGP connections can be bonded to the interconnected EGP array shown in FIGS. 3 and 4, as illustrated in accordance with a further embodiment of the present invention.

FIGS. 5 and 6 are cross-sectional views of a region of interconnected EGP array 70 illustrating a first exemplary manner in which one preformed EGP connection 60 can be formed in contact with the illustrated EGP 46. The illustrated region of interconnected EGP array 70 corresponds to dashed box 72 in FIG. 4 and encompasses a single EGP 46, which is included in completed FO-WLP 20 shown in FIGS. 1 and 2. While a limited portion of array 70 is shown, it will be understood that the below-described process steps are performed across EGP array 70 to produce EGP connections 60 bonded to the other EGPs included within array 70. With initial reference to FIG. 5, interconnected EGP array 70 can be attached to a temporary support structure or substrate 73, such as a carrier or vacuum chuck. Preformed EGP connections 60 can then be deposited over selected regions of EGP array 70 utilizing, for example, an inkjet printing, aerosol printing, or needle dispensing process. In one embodiment, a screen printing or stencil printing technique is utilized to produce preformed EGP connections 60 across EGP array 70. In this case, and as shown in FIG. 5, a stencil 76 having a number of openings 78 is positioned over interconnected EGP array 70. When stencil 76 is properly aligned to EGP array 70, stencil openings 78 overly the locations of interconnected EGP array 70 on which the preformed EGP connections 60 are desirably formed. As indicated in FIG. 5 by arrow 83, a flowable electrically-conductive material 79 is then applied over stencil 76 and into openings 78 utilizing a specialized squeegee 81. The geometry and positioning of stencil openings 78 thus defines the shape and size of preformed EGP connections 60. The flowable electrically-conductive material 79 can be selected from, for example, a particle-filled ink, electrically-conductive polymer, solder paste, solder-filled adhesive, and metal-containing adhesive or epoxy, such as silver-, nickel-, and copper-filled epoxies. Ultraviolet (UV) curing or thermal curing can then be performed, as needed. For example, in embodiments wherein electrically-conductive material 79 is an electrically-conductive ink containing metal nanoparticles, a high temperature sintering process can be carried-out. Stencil 76 is removed after curing to yield the completed EGP connections 60, which are bonded to surface 54 of EGP 46. The resultant structure is shown in FIG. 6.

By utilizing a stencil application process of the type described above, a large number of preformed EGP connections 60 can be produced across interconnected EGP array 70 in a relatively straightforward and highly efficient manner. In further embodiments, preformed EGP connections 60 can be produced utilizing other types of deposition or three dimensional printing processes capable of producing vertically-freestanding structures extending from the EGPs 46 included within EGP array 70. In still further embodiments, EGP connections 60 can be produced as discrete (e.g., metal) pieces, which are positioned at selected locations over EGP array 70. In this case, an electrically-conductive bonding material, such as solder paste or an electrically-conductive adhesive, can be applied onto selected regions of EGP array 70 prior to positioning of EGP connections 60. An example of this process is shown in FIG. 7, which again shows a limited region of EGP array 70 and a single EGP connection 60 (with two portions illustrated in FIG. 7) for clarity. As indicated by arrows 85, each portion of preformed EGP connection 60 is placed onto its respective EGP 46 included within interconnected EGP array 70 utilizing, for example, a pick-and-place tool. A bead of electrically-conductive adhesive 93 can be applied onto the appropriate regions of EGP array 70 prior to positioning of EGP connections 60. Alternatively, the adhesive or other bonding material can be applied onto EGP connections 60 prior to placement on EGP array 70. If needed, curing can be performed after positioning of EGP connection 60 and other non-illustrated EGP connections in their desired locations. The EGP connections 60 can be placed individually or can instead be placed as a group utilizing a specialized fixture or by forming physical interconnections between EGP connections 60 similar to spars 50 (FIGS. 1, 3, and 4), which are then severed during panel singulation. In still further embodiments, EGP connections 60 can have a solder finish and bonded to EGP array 70 by a solder reflow process.

Figure 8:
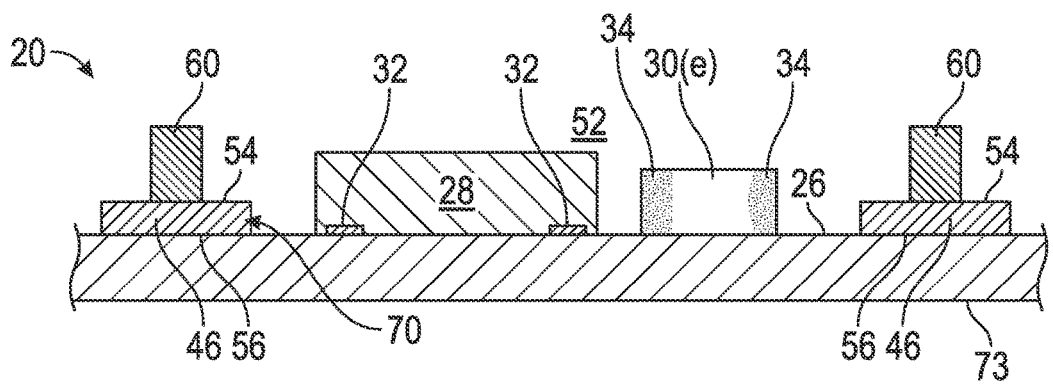
FIGS. 8-12 are cross-sectional views of the FO-WLP shown in FIGS. 1 and 2, as shown at various stages of completion and produced in accordance with an exemplary embodiment of the present invention.

After forming EGP connections 60 over or otherwise bonding EGP connections 60 to interconnected EGP array 70, one or more microelectronic devices are positioned within openings 52 provided in array 70. For example, as shown in FIG. 8, semiconductor die 28 and SMDs 30(a)-(e) can be positioned in the central opening 52 provided in the particular EGP 46 included within FO-WLP 20. Similar groupings of microelectronic devices can likewise be placed in the other EGP openings 52 provided across interconnected EGP array 70. If desired, EGP 46 can be attached to a new temporary substrate prior to positioning of semiconductor die 28, SMDs 30(a)-(e), and the other microelectronic within their respective EGP openings 52. Alternatively, temporary substrate 73 can be retained, as generally indicated in FIG. 8. In one embodiment, substrate 73 includes an upper adhesive or tape layer to retain the microelectronic devices in their desired positions through the below-described panelization process.

An encapsulation or panelization process is next carried-out. During the encapsulation, a non-illustrated mold frame having a central cavity or opening therein can be positioned over temporary substrate 73 and around EGP array 70, prefabricated EGP connections 60, semiconductor die 28, SMDs 30(a)-(e), and the various other microelectronic devices supported by substrate 73. An electrically-insulative encapsulant or mold compound, such as a silica-filled epoxy, is dispensed into the cavity of the mold frame. The encapsulant flows over and around EGP array 70, EGP connections 60, die 28, SMDs 30(a)-(e), and the other microelectronic devices supported by substrate 73. The encapsulant can then be solidified by thermal curing (e.g., heating in a partially-evacuated chamber) to yield a solid panel in which the above-listed components are embedded. The panel is conveniently produced as a relatively thin, disc-shaped body or mass having a generally circular planform geometry; however, the panel body can be fabricated to have any desired shape and dimensions. In other embodiments, the panel can be produced utilizing various other known fabrication techniques including, for example, compression molding, dispense, and lamination processes.

Figure 9:
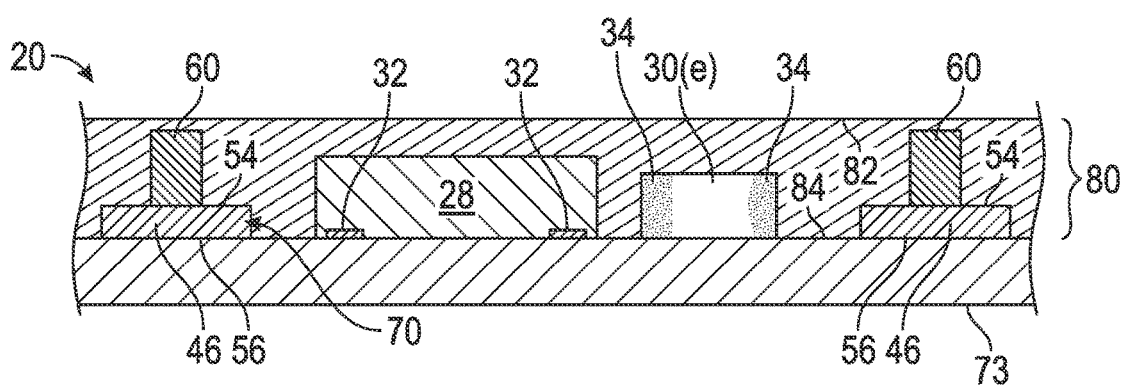
Figure 10:
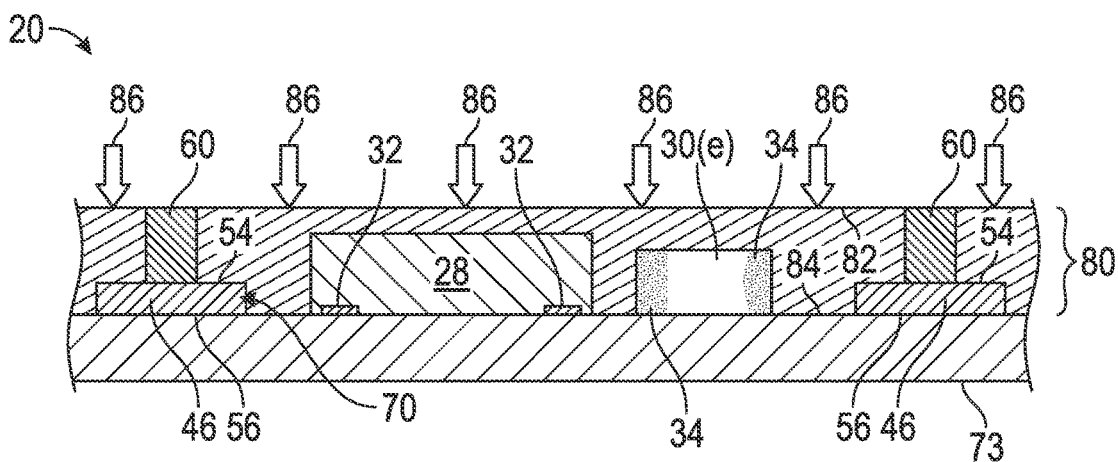

FIG. 9 illustrates a portion of a molded panel 80 produced pursuant to the above-described encapsulation process and encompassing partially-completed FO-WLP 20. While only the portion of molded panel 80 encompassing FO-WLP 20 is shown for clarity, it will be understood that molded panel 80 is considerably larger than the illustrated portion and contains other microelectronic components, EGPs, and preformed EGP connections similar or identical to those shown in the accompanying figures. Molded panel 80 includes a backside 82 and an opposing frontside 84. Semiconductor die 28 and SMDs 30(a)-(e) are positioned within molded panel 80 such that bond pads 32 and SMD terminals 34 are exposed at panel frontside 84. So too is outwardly-facing surface 56 of EGP 46 exposed at and substantially coplanar with panel frontside 84. At this juncture in fabrication, prefabricated EGP connections 60 remained buried within panel 80 and are covered by panel backside 82. Backside thinning is carried-out to remove a predetermined thickness from panel backside 82 sufficient to expose prefabricated EGP connections 60. Backside thinning can be accomplished utilizing a grinding, lapping, or Chemical Mechanical Polishing (CMP) process. The resultant structure is shown in FIG. 10 wherein backside thinning is represented by arrows 86. Backside thinning preferably imparts backside 82 with a substantially planar geometry; that is, a surface having a roughness less than about 10 μm.

Figure 11:
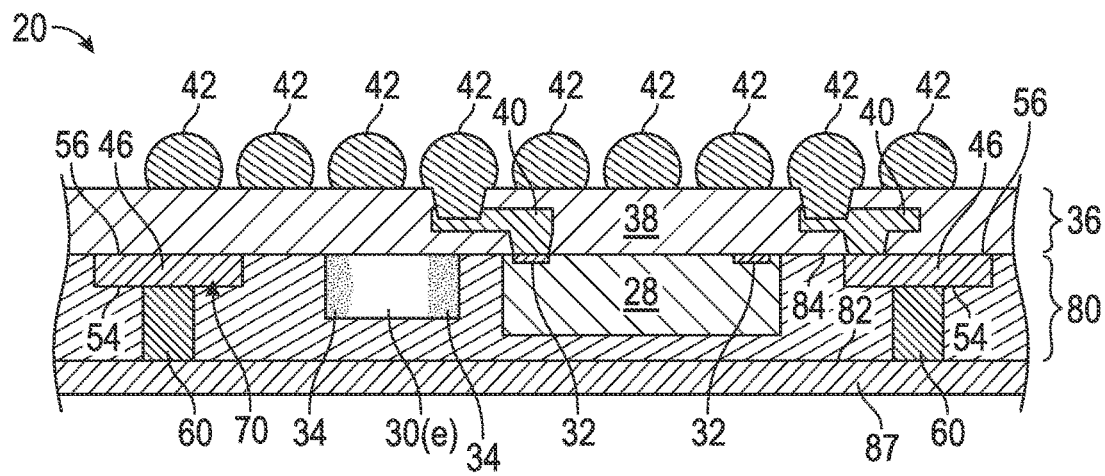

After backside thinning, molded panel 80 is thermally released or otherwise removed from temporary substrate 73 to reveal panel frontside 84. Molded panel 80 is then inverted and attached to a support structure, such as the ceramic carrier 87 shown in FIG. 11. With frontside 84 of molded panel 80 now facing upwards, RDLs 36 can be formed over panel 80 by spinning-on or otherwise depositing one or more dielectric layers and forming interconnect lines 40 therein. Interconnect lines 40 can be produced utilizing well-known lithographical patterning and conductive material (e.g., copper) deposition techniques. After build-up of RDLs 36, solder mask openings are formed in the outermost or last RDL (e.g., a solder mask layer) by lithographical patterning. BGA solder balls 42 can be deposited in contact with solder pads exposed by the solder mask openings and electrically coupled to interconnect lines 40. Solder reflow is then carried-out to form the desired solder joints between solder balls 42 and the underlying solder pads.

Figure 12:
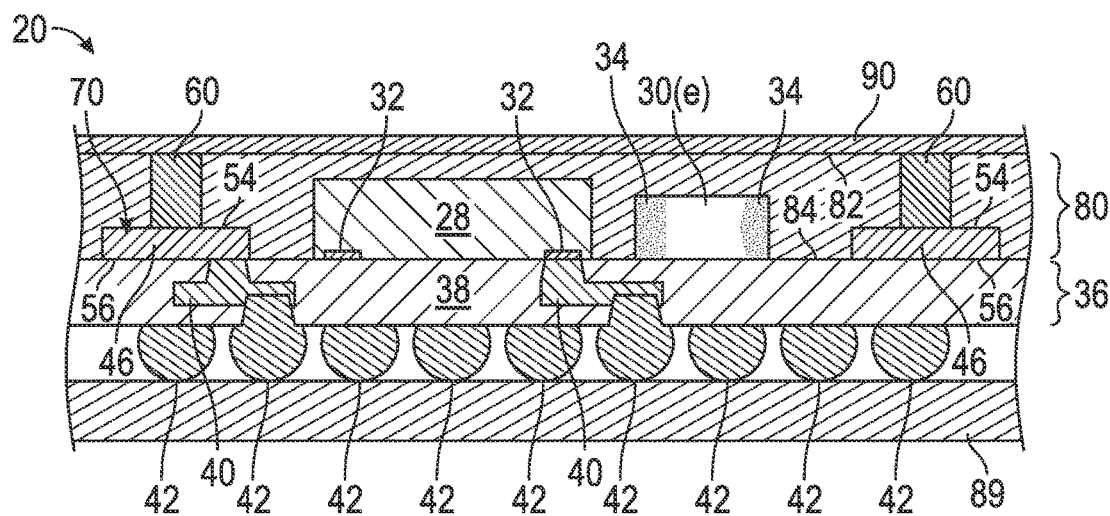

With reference to FIG. 12, molded panel 74 is next inverted and attached to another support structure 89. EMI shield structures are then formed over backside 82 of molded panel 80 and in ohmic contact with preformed EGP connections 60. In a preferred embodiment, a continuous or panel-wide electrically-conductive shield layer 90 is laminated onto or deposited over panel backside 82. When deposited over panel backside 82, panel-wide shield layer 90 can be produced utilizing a spraying, printing, or other conformal deposition process. In one embodiment, shield layer 90 is produced by spraying or otherwise depositing an electrically-conductive paint over backside 82 of molded panel 80. After deposition of electrically-conductive layer 90, molded panel 80 is singulated to produce a plurality of discrete FO-WLPs including completed FO-WLP 20, as shown in FIGS. 1 and 2. As may be appreciated by comparing FIG. 12 to FIGS. 1 and 2, singulation produces molded package body 22 from molded panel 80, produces EMI shield 62 from panel-wide shield layer 90, and separates EGP 46 from interconnected EGP array 70. Singulation is preferably carried-out utilizing a dicing saw; however, other singulation processes can also be utilized including, for example, laser cutting and water jetting.

There has thus been provided exemplary FO-WLPs and methods for producing FO-WLPs including preformed EGP connections. Advantageously, the EGP connections provide electrically conductive paths between the EGP and the backside of the molded package body to reduce processing requirements and to minimize the overall planform dimension of the FO-WLP. In certain embodiments, the preformed EGP connections can be electrically coupled to interconnect lines contained within one or more RDLs formed over the backside of the FO-WLP's molded package body. In other embodiments, the preformed EGP connections can be electrically coupled to an EMI shield bonded to the backside of the FO-WLP. The preformed EGP connections can be formed as one or more substantially continuous walls, which may extend fully or partially around the perimeter of the EGP. In this case, the EGP and the EGP connections can collectively produce an EMI cage, which at least partially surrounds one or more microelectronic devices embedded within the molded package body. As a result, RFI and other types of EMI originating from external sources and impinging on the FO-WLP can be minimized during operation of the FO-WLP or the unintended radiation of electromagnetic energy from the FO-WLP can be reduced. These advantages notwithstanding, the preformed EGP connections can assume other forms in alternative embodiments, such as a number of vertically-elongated columns bonded to the EGP at selected locations. To further illustrate this point, an exemplary embodiment of a FO-WLP including multiple discrete EGP connections will now be described in conjunction with FIGS. 13 and 14.

Figure 13:
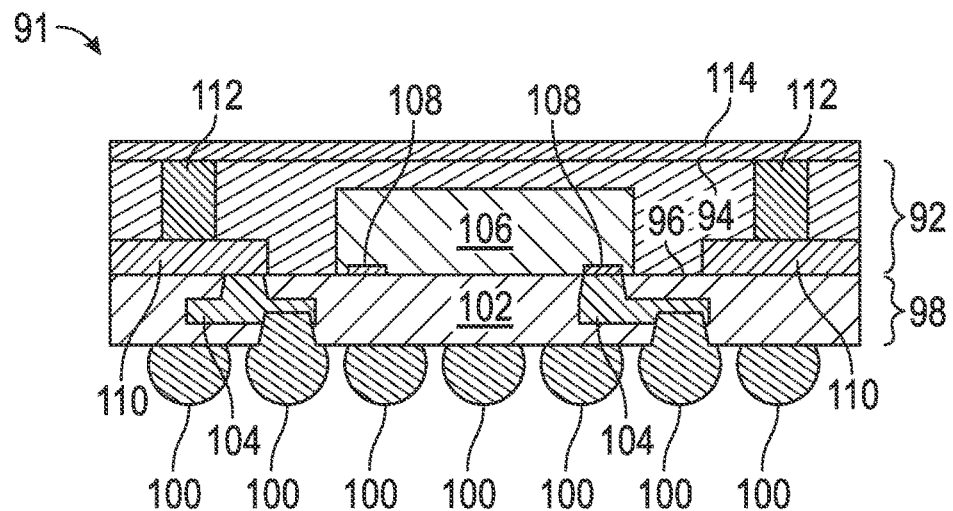
FIGS. 13 and 14 are side and planform cross-sectional views, respectively, of a FO-WLP including an EGP, a backside EMI shield, and a plurality of preformed EGP connection in the form of a number of vertically-elongated columns, as illustrated in accordance with a further exemplary embodiment of the present invention.
Figure 14:
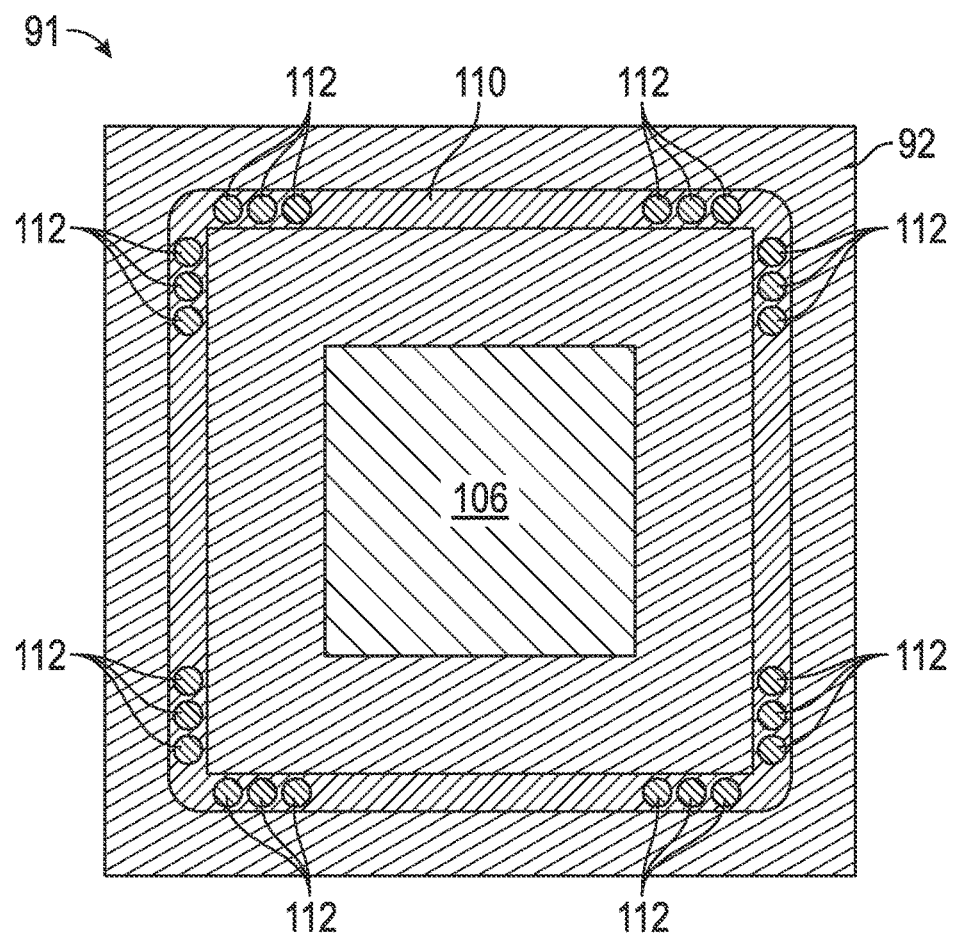

FIGS. 13 and 14 are side and planform cross-sectional views, respectively, of a FO-WLP 91, as illustrated in accordance with an exemplary embodiment of the present invention. In many respects, FO-WLP 91 is similar to FO-WLP 20 described above in conjunction with FIGS. 1-12. For example, FO-WLP 91 includes a molded package body 92 having a frontside 96 and a backside 94 (identified in FIG. 13). One or more RDLs 98 are formed over frontside 96 of molded package body 92, and a BGA including solder balls 100 is produced over the outermost or last RDL 98. RDLs 98 include a dielectric body 102 in which a number of interconnect lines 104 are formed. Interconnect lines 104 provide electrical communication between BGA solder balls 100 and the microelectronic device or devices embedded within molded package body 92. In the illustrated example, a single semiconductor die 106 is embedded within package body 92, and interconnect lines 104 provide electrical communication between bond pads 108 of die 106 and selected BGA solder balls 100 (FIG. 13). An EGP 110 and a plurality of preformed EGP connections 112 are further embedded in molded package body 92. As was the case previously, preformed EGP connections 112 extend from EGP 110 to backside 94 of molded package body 92 to provide vertical interconnect to, for example, a backside EMI shield 114 or other electrically-conductive structure, device, or feature provided on backside 94.

In contrast to EGP connections 60 of FO-WLP 20 (FIGS. 10-12), EGP connections 112 assume the form of a plurality of vertically-extending columns or elongated leads. In particular, and as observed most easily in FIG. 14, preformed EGP connections 112 are formed as discrete bodies or columns extending from selected locations of EGP 110. EGP connections 112 can be bonded to EGP 110 prior to formation of molded package body 92 (and, possibly, the larger molded panel from which body 92 is produced) utilizing any of the above-described processes. For example, EGP connections 112 can be discrete metal pins or wires, which are positioned utilizing a pick-and-place tool and bonded to EGP 110 utilizing an electrically-conductive adhesive. Alternatively, EGP connections 112 can be stud bumps or solder deposits deposited over EGP 110 prior to the panelization or encapsulation process. As a still further alternative, EGP connections 112 can be formed from a flowable, electrically-conductive material that is deposited over EGP 110 at selected locations. In this case, EGP connections 112 can be printed utilizing any dispensing technique allowing the selective deposition of an electrically-conductive ink in a predetermined pattern or design. A non-exhaustive list of suitable printing techniques includes inkjet printing, aerosol printing, and needle dispensing techniques, which are capable of printing vertically-freestanding columns extending away from EGP 110. In still further embodiments, EGP connections 112 can be formed utilizing a silk screen or stencil printing process of the type described above. Suitable electrically-conductive inks include, but are not limited to, inks containing relatively small metal particles, such as gold or silver particles in the nanometer range (e.g., particles having average diameters ranging from about 2 to about 50 nanometers). Thermal or ultraviolet curing can be performed after printing of the electrically-conductive ink traces, as appropriate, to produce EGP connections 112. Afterwards, process steps similar to those described above (e.g., panelization, frontside RDL build-up, and formation of EMI structure 114) can be carried-out to produce the completed FO-WLP 91 shown in FIGS. 13 and 14.

The foregoing has thus provided multiple exemplary embodiments of a FO-WLP and methods for producing FO-WLPs including preformed EGP connections. In at least some embodiments, the preformed EGP connections provide connection between an EGP and a backside EMI shield thereby electrically coupling the EMI shield to ground. In this case, the FO-WLP can provide effective shielding from EMI/RFI or can prevent or at least deter the undesired emission of electromagnetic energy from the FO-WLP itself. By virtue of this design, and in contrast to a TPV-based shield-ground connection, the shield-ground connection does not occupy an area that is otherwise available for the placement of components. The preformed EGP connections can be produced as one or more continuous walls to maximize EMI shielding or, instead, as a number of spaced, vertically-extending columns to provide multiple connections to the backside EMI shield. In further embodiments, the preformed EGP connections can assume other forms and can provide electrical connection to other electrically-conductive structures or devices located on the package backside, such as interconnect lines contained within one or more backside RDLs. In certain embodiments, the preformed EGP connections are produced by depositing one or more electrically-conductive elements onto the EGP prior to encapsulation within the molded package body or panel. The backside of the package body can be thinned to reveal the preformed EGP connections therethrough. An electrically-conductive shield material can then be applied to the package body backside and across the exposed portion of the EGP connections to complete the desired electrical connections. In further embodiments, the preformed EGP connections can be produced in other manners and can provide vertical interconnections to other electrically-conductive structures or devices present on the backside of the molded package body. The end result is a compact FO-WLP containing a backside-connected EGP, which can be produced utilizing highly efficient and cost effective manufacturing process.

In one embodiment, the above-described FO-WLP fabrication method includes the steps or processes of forming a molded panel around an EGP array to which a plurality of preformed EGP connections have been bonded, producing one or more RDLs over the molded panel, and then singulating the molded panel to yield a plurality of FO-WLPs each including a molded package body containing a singulated EGP separated from the EGP array and one or more of the preformed EGP connections. In another embodiment, the method includes the steps or process of bonding one or more EGP connections to an EGP and forming a molded package body around the EGP. The molded package body has a frontside and an opposing backside to which the EGP connections extend. An EMI shield is then produced over the backside of the molded package body and electrically coupled to the EGP through the one or more EGP connections.

The foregoing has also provided embodiments of a FO-WLP. In one embodiment, the FO-WLP includes a molded package body having a frontside and an opposing backside. An EGP is contained within the molded package body. At least one preformed EGP connection is bonded to the EGP and extends to the backside of the molded package body. In certain embodiments, the FO-WLP can further include an EMI shield bonded to the backside of the molded package body and electrically coupled to the EGP through the at least one preformed EGP connection. Additionally, the FO-WP can also include a semiconductor die, and RF circuitry electrically coupled to the semiconductor die. In this case, the EGP and the at least one preformed EGP connection can extend at least partially around the RF circuitry and the semiconductor die. For example, the at least one preformed EGP connection comprises a substantially continuous wall cooperating with the EMI shield to form a box-like structure or EMI cage enclosing the RF circuitry and the semiconductor die. In further embodiments, the at least one preformed EGP connection can assume the form of a plurality of electrically-conductive columns formed at selected locations around the perimeter of the EGP. In still further embodiments, the at least one preformed EGP connection can assume the form of at least one wall extending along one or more sides of the EGP.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It should be understood that various changes can be made in the function and arrangement of elements described in an exemplary embodiment without departing from the scope of the invention as set-forth in the appended claims.

As appearing in the foregoing Detailed Description, terms such as "comprise," "include," "have," and the like are intended to cover non-exclusive inclusions, such that a process, method, article, or apparatus that comprises a list of elements is not necessarily limited to those elements, but can include other elements not expressly listed or inherent to such process, method, article, or apparatus. As still further appearing herein, terms such as "over," "under," "on," and the like are utilized to indicate relative position between two structural elements or layers and not necessarily to denote physical contact between structural elements or layers. Thus, a first structure or layer can be described as fabricated "over" or "on" a second structure, layer, or substrate without indicating that the first structure or layer necessarily contacts the second structure, layer, or substrate due to, for example, presence of one or more intervening layers. As appearing further herein, the term "microelectronic device" is utilized in a broad sense to refer to an electronic device, element, or structure produced on a relatively small scale and amenable to packaging in the above-described manner. Microelectronic devices include, but are not limited to, integrated circuits formed on semiconductor die, Microelectromechanical Systems (MEMS) devices, passive electronic components, optical devices, and other small scale electronic devices capable of providing processing, memory, sensing, RF, optical, and actuator functionalities, to list but a few examples. Microelectronic devices also include other discrete or separately-fabricated structures that can be integrated into the package, such as preformed via structures and preformed antenna structures.

What is claimed is:

1. A method for fabricating Fan-Out Wafer Level Packages (FO-WLPs), comprising:

bonding a plurality of preformed connections to a ground plane array, the ground plane array comprising a plurality of ground plane structures interconnected by a plurality of spars;

after bonding the plurality of preformed connections to the ground plane array, placing the plurality of preformed connections and the ground plane array on a temporary substrate;

after placing the plurality of preformed connections and the ground plane array on the temporary substrate, forming a molded panel over the temporary substrate and around the ground plane array and the plurality of preformed connections to yield an Embedded Ground Plane (EGP) array and a plurality of preformed EGP connections, respectively;

after forming the molded panel, removing material from a backside of the molded panel to thin the molded panel and expose the plurality of preformed EGP connections;

after removing material from the backside of the molded panel, removing the temporary substrate to expose a frontside of the molded panel;

after removing the temporary substrate, producing one or more Redistribution Layers (RDLs) over the frontside of the molded panel; and after producing the one or more RDLs over the frontside of the molded panel, singulating the molded panel and severing the ground plane array through the plurality of spars to yield a plurality of FO-WLPs, each of the plurality of FO-WLPs including a molded package body containing a singulated EGP separated from the EGP array and one or more of the preformed EGP connections.

2. The method of claim 1 further comprising providing an Electromagnetic Interference (EMI) shield on the backside of the molded package body and electrically coupled to the singulated EGP through the one or more preformed EGP connections.

3. The method of claim 1 further comprising depositing at least one continuous electrically-conductive layer over the backside of the molded panel and in ohmic contact with the plurality of preformed EGP connections, the at least one continuous electrically-conductive layer forming Electromagnetic Interference (EMI) shields included within the plurality of FO-WLPs when the molded panel is singulated.

4. The method of claim 1 wherein bonding the plurality of preformed ground plane connections to the ground plane array, comprises:
dispensing an electrically-conductive material in a predetermined pattern over the ground plane array; and
curing the electrically-conductive material to produce the plurality of preformed connections.

5. The method of claim 4 wherein dispensing comprises:
positioning a stencil over the ground plane array, the stencil having stencil openings defining a shape and position of the plurality of preformed connections; and
applying the electrically-conductive material into the stencil openings and onto the ground plane array.

6. The method of claim 4 wherein the electrically-conductive material comprises a metal particle-filled adhesive, and wherein the curing comprises sintering the metal particle-filled adhesive to produce the plurality of preformed connections.

7. The method of claim 1 wherein the plurality of preformed connections comprise a plurality of electrically-conductive structures, and wherein bonding comprises bonding the plurality of electrically-conductive structures to the ground plane array utilizing an electrically-conductive adhesive prior to forming the molded panel.

8. The method of claim 1 wherein forming comprises forming the molded panel around the ground plane array, the plurality of preformed connections, and a plurality of electrical components positioned in openings provided in the ground plane array.

9. The method of claim 8 wherein the plurality of preformed connections comprise substantially continuous walls extending around the openings provided in the ground plane array and a semiconductor die positioned therein.

10. The method of claim 9 further comprising:
positioning the electrical components in the openings and surrounded by the substantially continuous walls, wherein the electrical components are selected from semiconductor die and discrete components, and wherein at least some of the electrical components are configured to operate at radio frequencies (RF); and
forming at least one Electromagnetic Interference (EMI) shield on the backside of the molded package body cooperating with the substantially continuous walls to form an EMI cage enclosing the electrical components.

11. The method of claim 1 further comprising producing the plurality of preformed connections as a plurality of vertically-extending columns projecting upwardly from selected locations of the ground plane array.

12. The method of claim 1 wherein bonding comprises:
aligning a stencil with the ground plane array;
after aligning the stencil to the ground plane array, utilizing a squeegee to applying an electrically-conductive material over the stencil and into openings provided in the stencil;
curing the electrically-conductive material to form the plurality of preformed connections; and
after curing, removing the stencil from over the ground plane array.

13. The method of claim 1 wherein removing material comprises thinning the backside of the molded panel to expose portions of the plurality of preformed EGP connections, while imparting the backside with a substantially planar geometry; and
wherein the method further comprises, after thinning, forming an Electromagnetic Interference (EMI) shield on the backside of the molded package body and in electrical contact with the exposed portions of the plurality of preformed EGP connections.

14. The method of claim 1 further comprising:
selecting the plurality of ground plane structures to comprise rectangular bodies; and
forming the plurality of preformed connections to comprise continuous walls extending over and around the rectangular bodies of the plurality of ground plane structures.

* * * * *